United States Patent
Chan et al.

(10) Patent No.: US 8,330,476 B2
(45) Date of Patent: Dec. 11, 2012

(54) DYNAMIC VOLTAGE AND POWER MANAGEMENT BY TEMPERATURE MONITORING

(75) Inventors: Nancy Chan, Richmond Hill (CA); Ramesh Senthinathan, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 1703 days.

(21) Appl. No.: 11/215,918

(22) Filed: Aug. 31, 2005

(65) Prior Publication Data

US 2007/0045825 A1    Mar. 1, 2007

(51) Int. Cl.
*G01R 27/08* (2006.01)
(52) U.S. Cl. .................. 324/721; 219/494; 323/907
(58) Field of Classification Search .................. 324/522
See application file for complete search history.

(56) References Cited

U.S. PATENT DOCUMENTS

| | | | |
|---|---|---|---|
| 5,440,520 A * | 8/1995 | Schutz et al. | 361/103 |
| 5,940,785 A | 8/1999 | Georgiou et al. | |
| 6,047,248 A | 4/2000 | Georgiou et al. | |
| 6,509,788 B2 | 1/2003 | Naffziger et al. | |
| 6,789,037 B2 | 9/2004 | Gunther et al. | |
| 6,809,978 B2 * | 10/2004 | Alexander et al. | 365/211 |
| 7,214,910 B2 * | 5/2007 | Chen et al. | 219/494 |
| 2005/0188230 A1 * | 8/2005 | Bilak | 713/300 |
| 2005/0201188 A1 * | 9/2005 | Donze et al. | 365/232 |

* cited by examiner

*Primary Examiner* — Timothy J Dole
(74) *Attorney, Agent, or Firm* — Faegre Baker Daniels LLP

(57) ABSTRACT

A supply voltage management system and method for an integrated circuit (IC) die are provided. The supply voltage management system includes one or more temperature sensing elements located on the IC die and configured to sense temperature of the die and to output a sensed temperature value for the die. A dynamic voltage controller is located on the die and is configured to receive the sensed temperature value for the die and to identify a technology process category of the die. Based on the sensed temperature value and the identified technology process category of the die, the dynamic voltage controller adjusts an output voltage to at least one circuit of the die.

11 Claims, 10 Drawing Sheets

PVT TABLE ←—300

| AVAILABLE PROCESS CATEGORY DATA | TEMPERATURE THRESHOLD DATA (AVAILABLE PROCESS CATEGORY, TEMPERATURE) | OPERATING VOLTAGE VALUE (AVAILABLE PROCESS CATEGORY, VOLTAGE) |
|---|---|---|
| #1 | $T_{MIN1} \le T_x < T_{1,1}$<br>$T_{1,1} \le T_x < T_{1,2}$<br>$T_{1,2} \le T_x < T_{1,3}$<br>⋮ | $V_{1,1}$<br>$V_{1,2}$<br>$V_{1,3}$ |
| #2 | $T_{MIN2} \le T_x < T_{2,1}$<br>$T_{2,1} \le T_x < T_{2,2}$<br>$T_{2,2} \le T_x < T_{2,3}$<br>⋮ | $V_{2,1}$<br>$V_{2,2}$<br>$V_{2,3}$ |
| #3 | $T_{MIN3} \le T_x < T_{3,1}$<br>$T_{3,1} \le T_x < T_{3,2}$<br>$T_{3,2} \le T_x < T_{3,3}$<br>⋮ | $V_{3,1}$<br>$V_{3,2}$<br>$V_{3,3}$ |
| ⋮ | ⋮ | ⋮ |
| #N | $T_{MINN} \le T_x < T_{N,1}$<br>$T_{N,1} \le T_x < T_{N,2}$<br>$T_{N,2} \le T_x < T_{N,3}$<br>⋮ | $V_{N,1}$<br>$V_{N,2}$<br>$V_{N,3}$<br>⋮ |

FIG. 3

PVT TABLE  ← 700

| AVAILABLE PROCESS CATEGORY (APC) DATA | AVAILABLE NOMINAL OPERATING VOLTAGE (ANOV) DATA | TEMPERATURE THRESHOLD DATA (APC, ANOV, TEMPERATURE) | OPERATING VOLTAGE VALUE (APC, ANOV, VOLTAGE) |
|---|---|---|---|
| #1 | 5.0 V | $T_{1,5,MIN} \leq T_X < T_{1,5,1}$ | $V_{1,5,1}$ |
| | | $T_{1,5,1} \leq T_X < T_{1,5,2}$ | $V_{1,5,2}$ |
| | | ⋮ | ⋮ |
| | 3.2 V | $T_{1,3.2,MIN} \leq T_X < T_{1,3.2,1}$ | $V_{1,3.2,1}$ |
| | | $T_{1,3.2,1} \leq T_X < T_{1,3.2,2}$ | $V_{1,3.2,2}$ |
| | | ⋮ | ⋮ |
| | 1.8 V | $T_{1,1.8,MIN} \leq T_X < T_{1,1.8,1}$ | $V_{1,1.8,1}$ |
| | | $T_{1,1.8,1} \leq T_X < T_{1,1.8,2}$ | $V_{1,1.8,2}$ |
| | | ⋮ | ⋮ |
| #2 | 5.0 V | $T_{2,5,MIN} \leq T_X < T_{2,5,1}$ | $V_{2,5,1}$ |
| | | $T_{2,5,1} \leq T_X < T_{2,5,2}$ | $V_{2,5,2}$ |
| | | ⋮ | ⋮ |
| | 3.2 V | $T_{2,3.2,MIN} \leq T_X < T_{2,3.2,1}$ | $V_{2,3.2,1}$ |
| | | $T_{2,3.2,1} \leq T_X < T_{2,3.2,2}$ | $V_{2,3.2,2}$ |
| | | ⋮ | ⋮ |
| | 1.8 V | $T_{2,1.8,MIN} \leq T_X < T_{2,1.8,1}$ | $V_{2,1.8,1}$ |
| | | $T_{2,1.8,1} \leq T_X < T_{2,1.8,2}$ | $V_{2,1.8,2}$ |
| | | ⋮ | ⋮ |
| ⋮ | ⋮ | ⋮ | ⋮ |
| | ⋮ | ⋮ | ⋮ |
| | ⋮ | ⋮ | ⋮ |

FIG. 7

DYNAMIC VOLTAGE AND POWER MANAGEMENT BY TEMPERATURE MONITORING

FIELD OF THE INVENTION

The present invention relates generally to management of power consumption by an integrated circuit (IC, and also referred to commonly and herein as a "chip") and more particularly, to the dynamic control of voltage supplied to die localities, herein referred to as voltage islands, according to the monitored temperature.

BACKGROUND OF THE INVENTION

Integrated circuits or ICs are used in numerous applications, such as microprocessors, memories, application specific ICs (ASICs), graphics processors, and the list is an ever increasing list. As the IC (also commonly referred to as a "chip") has evolved into a smaller and smaller package, with an ever increasing density of circuits, the task of designing chips or ICs that achieve a desired performance (e.g., faster processing speeds) has been challenged with an ever increasing issue concerning power consumption. Typically, the larger the power consumption for a chip, the higher the chip operating temperature. Higher operating temperatures may lead to a lower chip performance and even incorrect functioning of the chip. Managing power consumption for a chip may help in chip performance and correct operation of chip-based device. For example, managing the power consumption of ICs in a laptop may provide a longer battery life for battery operation of the laptop, while a reduced operating temperature may lead to less faults and greater operating longevity of the laptop.

Various approaches have been used to address the above issues. One approach has been to manage power consumption by controlling the clock frequency driving the circuitry of the chip. For example, Naffziger et. al. (U.S. Pat. No. 6,509,788) describes an embodiment in which an on-chip oscillator is utilized to provide the clock frequency for the chip's core circuitry. Such an oscillator can dynamically adjust the clock frequency to manage the chip's power consumption. As described, the oscillator is preferably operable to adjust its output frequency based on the voltage supplied to the oscillator to effectively manage the chip's power consumption. Design strategies attempting to utilize such dynamic variation of clock frequency and supply voltage based on computational loads are commonly referred to as dynamic voltage scaling (DVS). However, with all the DVS approaches, operating the circuitry of the chip at different clock frequencies may interfere with attaining the desired speed or throughput of the chip, and may be a limiting approach for very high-speed chips. Moreover, as described in Naffziger, an on-chip oscillator is required to generate the processor clock instead of the usual synchronous, externally controlled clock generator.

Another approach to managing power consumption of an IC device has been described by Gunther et. al. (U.S. Pat. No. 6,789,037). Gunther describes an integrated, on-chip thermal management system providing closed-loop temperature control of an IC device and methods of performing thermal management of an IC device. Through a temperature detection element, the temperature of the IC die may be detected and monitored. A power modulation element may reduce the power consumption of the IC device by limiting the speed at which the IC device executes instructions, by limiting the number of instructions executed, by directly lowering the power consumption of the IC device, or by a combination of these techniques. However, this approach may also be limiting for desired very high speed ICs.

Yet another approach to managing IC power consumption is provided in Georgiou et. al (U.S. Pat. No. 6,047,248). Georgiou describes a system and method using thermal feedback to cooperatively vary a voltage and frequency of a circuit to control heating while maintaining synchronization. Preferably, on-chip thermal sensors are used for feedback. Essentially, a voltage regulator and a clock selector are adapted to cooperatively vary the voltage and the frequency of the circuit to a predetermined voltage-frequency pair, responsive to a voltage/clock control signal that is enabled based on a decoded temperature signal and a predetermined temperature threshold. Again, however, changing the frequency of operation of the IC circuitry may have a negative impact on the desired higher speed operation of very high-speed chips.

In view of the above, and as a consequence of the long felt need for improvement in chip or IC power consumption efficiency, a method and system is needed for increasing the power efficiency of an IC through accurate management of the IC power consumption.

BRIEF DESCRIPTION OF THE DRAWINGS

The invention will be more readily understood in view of the following description when accompanied by the below figures and wherein like reference numerals represent like elements:

FIG. 3 illustrates a table showing an example of a process-voltage-temperature (PVT) table according to an embodiment of the invention;

FIG. 7 illustrates a table showing an example of a process-voltage-temperature (PVT) table for a plurality of voltage islands (VIs) of an integrated circuit die according to an embodiment of the invention;

DETAILED DESCRIPTION OF THE INVENTION

The present invention relates to management of power consumption by an integrated circuit (IC) for increased chip performance. In particular, one or more dies of the IC may have power consumption controlled by a supply voltage management system located on the die. The supply voltage management system of a die may control output voltage to each of a plurality of die localities or voltage islands (VIs) of the die. The output voltage to a die or to a VI of a die, and thus the power consumption of the die or of the VI of a die, may be controlled based in part on the monitored temperature and a particular technology process category of the die or VI.

Figure 1:
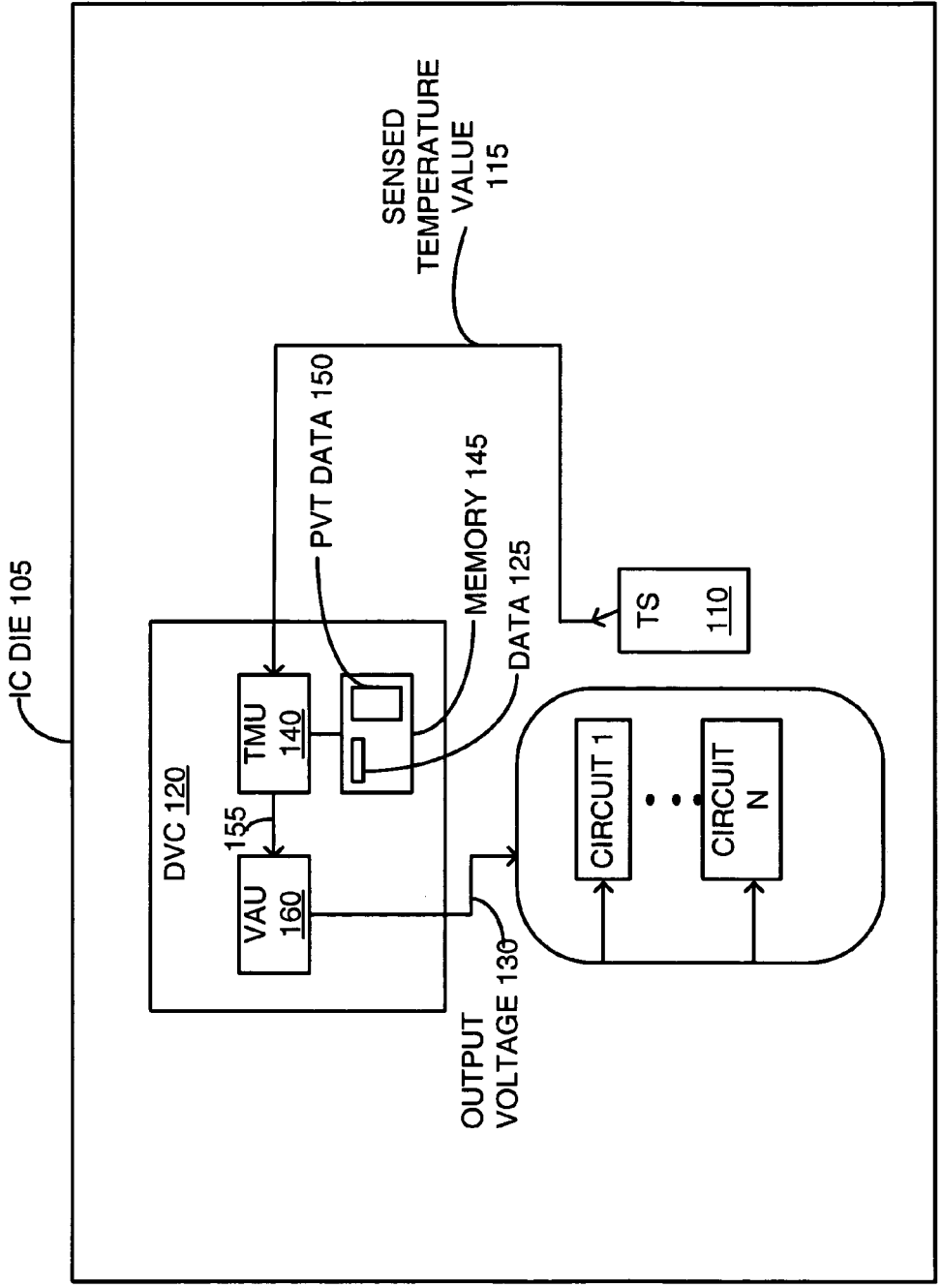
FIG. 1 illustrates a schematic block diagram of an example of a supply voltage management system for an integrated circuit die according to an embodiment of the invention.

FIG. 1 illustrates a schematic block diagram of an example of a supply voltage management system 100 for an integrated circuit (IC) die 105 according to one embodiment of the invention. One or more temperature sensing elements 110 are located on the die 105 and configured to sense temperature of the die 105 and to output a sensed temperature value 115 for the die 105. The temperature sensing elements 110 may be any conventional temperature sensors that sense temperature based on a change in voltage, current, pressure, light, or any other suitable criteria for sensing temperature or temperature change. The sensed temperature from the one or more temperature sensing elements 110 may then be used to produce a sensed temperature value 115. In the embodiment of FIG. 1, the temperature sensing element 110 senses the temperature and produces a temperature value 115. The temperature sensing element or elements 110 may be located on the die 105 by integrating the element 110 in the die 105 during fabrication of the die 105 or by mounting the temperature sensing element 110 onto the die 105 after fabrication of the die 105. The temperature sensing element can be a thermal diode that senses a change in voltage or current as a results of thermal change, or even together with a processing unit to provide a readout of the sense temperature value, or any other suitable sensor configuration.

A dynamic voltage controller 120, such as a suitable logic, located on the die 105 is configured to receive the sensed temperature value 115 for the die 105 and to identify a technology process category of the die 105 at initialization. Based on the sensed temperature value 115 and the identified technology process category, an output voltage 130 to at least one circuit of the die 105 is adjusted, e.g. the voltage 130 to Circuit 1 . . . Circuit N of FIG. 1 are adjusted according to a look up table.

Process categories may be identified at the time of fabrication of the silicon wafer, and may also be referred to as process corners. Processing characteristics of the die 105 determine the technology process category of the die 105. Data may be stored in a memory in the die, e.g. data 125 in a register of memory 145 of FIG. 1, that may be referenced directly or indirectly to identify the processing category of the die 105. Population of the data 125 in the memory 145 may result at the time of fabrication of the chip at the fabrication facility, or may be a result of initialization of the die and testing during initialization. For example, the Circuit 1 . . . Circuit N of FIG. 1 may be exercised at initialization or at boot-up time to determine the technology process category of the die by a self test. Once the technology process category of the die is determined, the data 125 of the memory 145 may be updated accordingly.

FIG. 1 shows the dynamic voltage controller 120 as including the memory 145, a temperature monitoring unit (TMU) 140, and a voltage adjusting unit (VAU) 160. The memory 145 stores data for identifying the technology process category, e.g. the data 125, and stores predetermined process-voltage-temperature (PVT) data. The temperature monitoring unit 140 is operatively responsive to the sensed temperature value 115 and, using the identified technology process category of the die 105 and the sensed temperature value 115, accesses the PVT data 150 to obtain an desired operating voltage value 155. The voltage adjusting unit 160 is configured to receive the desired operating voltage value 155 from the temperature monitoring unit 140 and adjust the output voltage 130, such as a circuit supply voltage, based on the desired operating voltage value 155.

Figure 2:
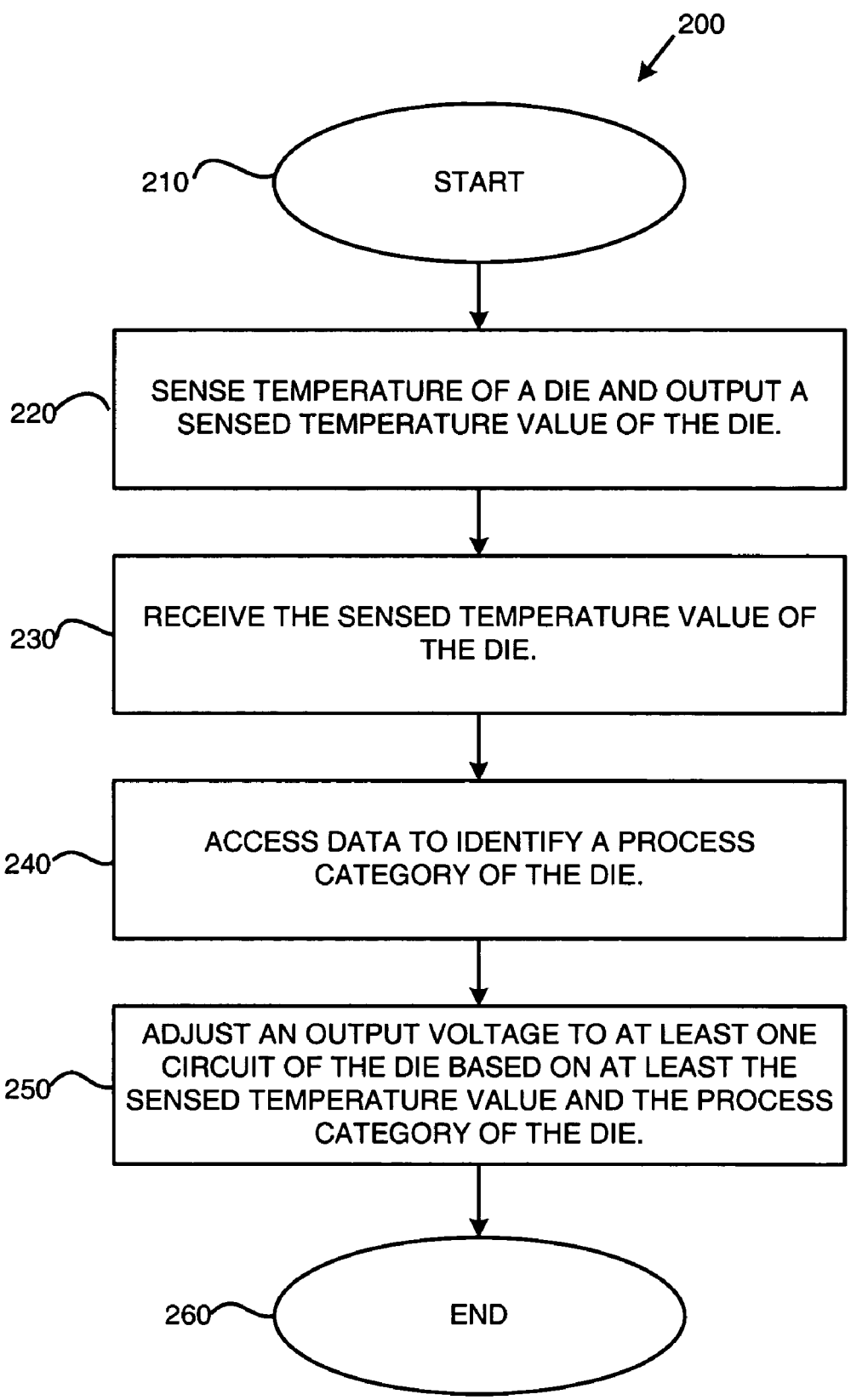
FIG. 2 illustrates a flowchart showing an example of a method for adjusting an output voltage to at least one circuit of an integrated circuit die according to an embodiment of the invention.

FIG. 2 illustrates a flowchart showing an example of a method 200 for adjusting an output voltage to at least one circuit of an integrated circuit die according to an embodiment of the invention. The method 200 begins with the process block 210. At block 220, the temperature of the die 105 is sensed by the temperature sensor 110 and the temperature sensor 110 outputs a sensed temperature value 115. At process block 230, the sensed temperature value 115 is received by the temperature monitoring unit 140. At process block 240, the temperature monitoring unit 140 accesses the memory 145, e.g. the data 125, to obtain the stored technology process category of the die 105. The data 125 may represent the technology process category directly or may point to other data from which the technology process category of the die 105 may be obtained. Those having ordinary skill in the art will recognize the various mechanisms that may be employed, for example pointers, that may be used to finally determine the technology process category value. At process block 250, the voltage adjusting unit 160 adjusts an output voltage 130 to the at least one circuit of the die 105 based on at least the sensed temperature value 115 and the technology process category of the die 105. As explained for FIG. 1, the sensed temperature value 115 and the technology process category of the die 105 may be used to obtain an desired operating voltage value 155, the desired operating voltage value 155 then being employed by the voltage adjusting unit 160 to adjust the output voltage 130. It should be understood that the method 200 may be performed iteratively to repeatedly sense the temperature value 115 of the die 105 and repeatedly adjust the output voltage 130 to the circuits, e.g. Circuit 1 . . . Circuit N, of the die 105 during normal operation of the circuits.

Figure 4:
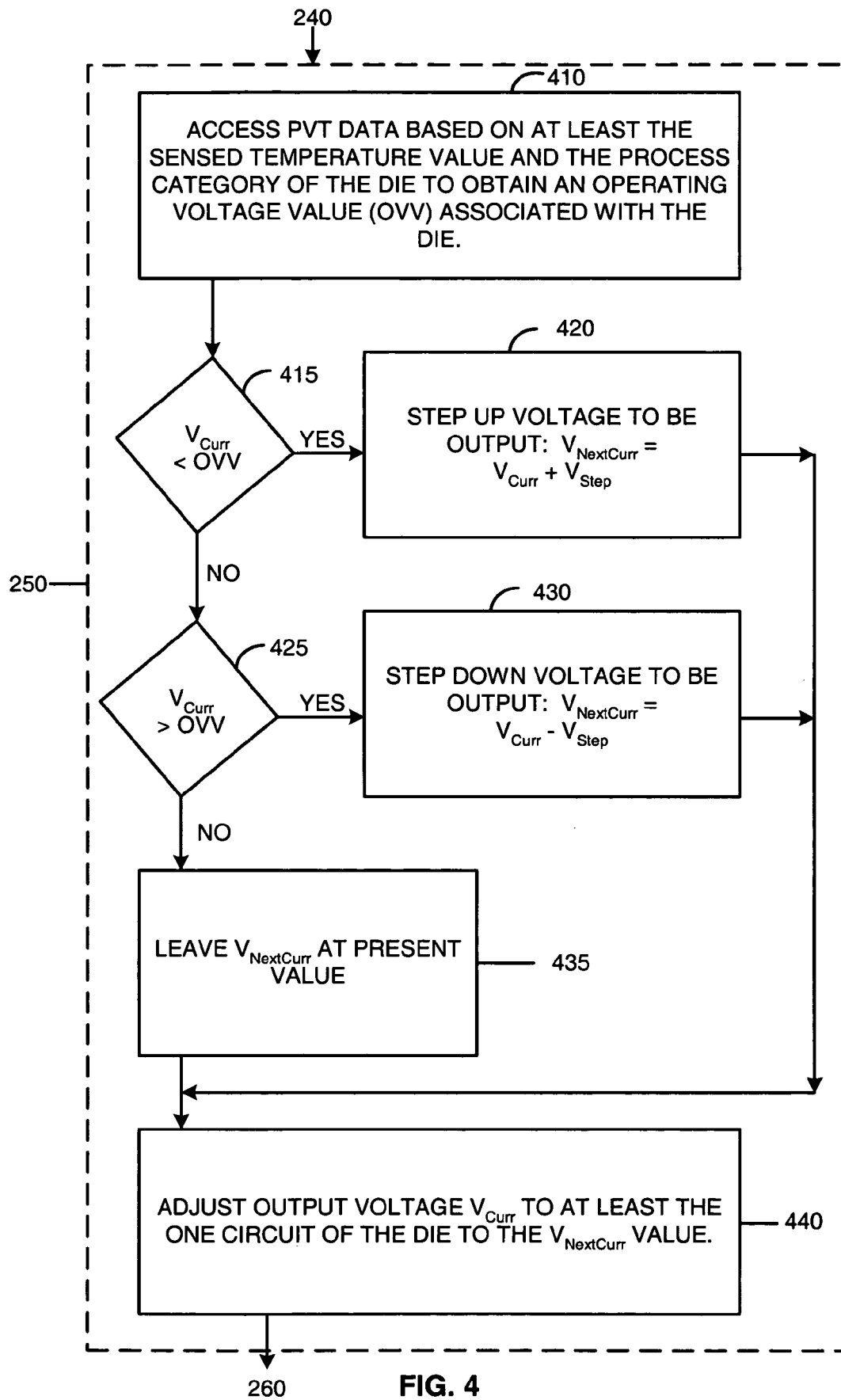
FIG. 4 illustrates a flowchart showing an example of an expanded block of the example method of the flowchart illustrated in FIG. 2.

FIG. 3 illustrates a table showing an example of a process-voltage-temperature data in the form of (PVT) table 300 according to an embodiment of the invention. The PVT table 300 of FIG. 3 shows three columns. The first column has the title "Available Technology Process Category Data", the second "Temperature Threshold Data", and the third "Desired operating voltage value". The Available Technology Process Category Data of column 1 may be numerical values starting from 1 and going through N for N possible process categories. When the process block 240 of FIG. 2 accesses the memory 145, the identified technology process category of the die 105 is matched against the Available Technology process category Data of column 1 to determine a row, e.g. the row #3 corresponding to a technology process category of #3. For row #3, the sensed temperature value 115 received at process block 230 of FIG. 2 is compared to the Temperature Threshold Data of column 2. Based on the temperature range or threshold that the sensed temperature value 115 is found, a corresponding desired operating voltage value from column 3 is determined. For example, if the sensed temperature value 115 is a value $T_x$ between $T_{3,1}$ and $T_{3,2}$ of the temperature threshold data in row 3 column 2, then the desired operating voltage value $V_{3,2}$ of column 3 corresponds to the desired operating voltage value. In this manner, the PVT table 300 of FIG. 3 may be used to look up an desired operating voltage value, e.g., an desired operating voltage value 155 of FIG. 1, based on an identified technology process category and a sensed temperature value 115. For the example of the PVT table 300, the table may be designed or predetermined based on a nominal operating voltage, for example 5.0 volts. The nominal operating voltage may be a result of the amount circuitry on the die 105 to be operated. Thus, the desired operating voltage value, as obtained from the PVT table 300 for example, may serve to adjust the nominal operating voltage based on current temperature value and technology process category of the die 105. In this manner, the output voltage 130 may be adjusted according to the desired operating voltage value 155 obtained from the PVT table 300 to realize a more desired power consumption by the die 105 than would be realized by always operating the die 105 at the nominal operating voltage. FIG. 4 shows an example of how the output voltage 130 may be adjusted incrementally towards the desired operating voltage value 155.

FIG. 4 illustrates a flowchart showing an example of an expanded block 250 of the example method 200 illustrated in FIG. 2. The expanded block 250 begins at process block 410 where PVT data of the PVT table 300 is accessed based on at least the sensed temperature value 115 and the technology process category of the die 105 to obtain an desired operating voltage value 155. Processing proceeds to block 415 where the current output voltage 130 is compared to the desired operating voltage value 155. If the current output voltage 130 is less than the desired operating voltage value 155, processing proceeds to block 420 where a next current output voltage variable is set to the value of the current output voltage 130 incremented by a step amount of voltage. The step amount of voltage may be predetermined or may be determined as, for example, the absolute value of the difference between the current output voltage 130 and the desired operating voltage value 155. From block 420 processing flows to process block 440. Alternatively, if the current output voltage 130 is not less than the desired operating voltage value 155, processing proceeds to process block 425 which tests for the current output voltage 130 being greater than the desired operating voltage value 155. If so, at process block 430 the next current output voltage variable is set to the current output voltage 130 minus a step amount of voltage. Processing then proceeds to block 440. If at block 425 the current output voltage 130 is not greater than the desired operating voltage value 155, processing then proceeds to block 435 where the next current output voltage variable is left at its present value, namely at the value of the current output voltage 130. Processing from any of the blocks 420, 430, and 435 proceeds to the processing block 440 which sets the current output voltage 130 to the value of the next current output voltage variable. From block 440, processing continues at process block 260 of FIG. 2. As shown in FIG. 4, the current output voltage 130 may have been adjusted up or down or left the same depending on the comparison of the current output voltage 130 to the desired operating voltage value 155.

Figure 5:
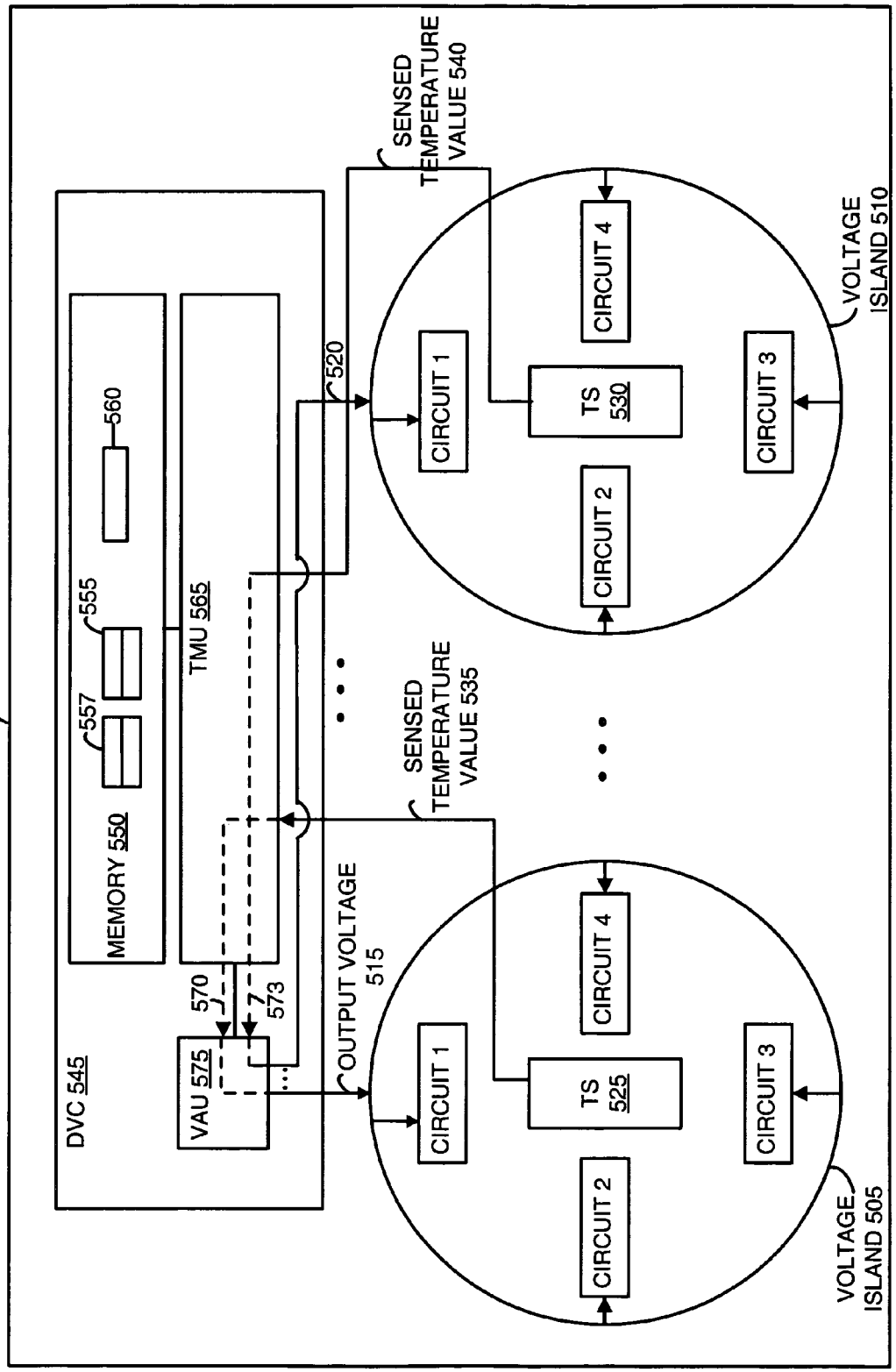
FIG. 5 illustrates a schematic block diagram of an example of a supply voltage management system for managing output voltages to a plurality of voltage islands (VIs) of an integrated circuit die according to an embodiment of the invention.

FIG. 5 illustrates a schematic block diagram of an example of a supply voltage management system 500 for managing output voltages to a plurality of voltage islands (VIs), for example VI 505 and VI 510, of an integrated circuit die 503 according to an embodiment of the invention. One or more temperature sensing elements, for example temperature sensing elements 525 and 530 associated correspondingly with VI 505 and VI 510, are located on the die 503 and configured to sense temperature. For example, temperature sensing elements 525 may sense the temperature of VI 505 and temperature sensing element 530 may sense the temperature of VI 510. The sensed temperature from the one or more temperature sensing elements, e.g., temperature sensing elements 525 and 530, may then be used to produce a sensed temperature value, e.g., the corresponding sensed temperature values 535 and 540.

A dynamic voltage controller 545 located on the die 503 is configured to receive a plurality of sensed temperature values corresponding to a plurality of VIs of the die 503, and to adjust respectively a plurality of output voltages to the corresponding plurality of VIs. For example, the dynamic voltage controller 545 is configured to receive the sensed temperature value 535 for VI 505 and to identify a technology process category of the die 503. Based on the sensed temperature value 535 and the identified technology process category, the output voltage 515 to the circuitry of VI 505 is adjusted. Likewise, the dynamic voltage controller 545 receives the sensed temperature value 540, and based on the sensed temperature value 540 and the technology process category of the die 503, the output voltage 520 to the circuitry of VI 510 is adjusted.

Data may be stored in a memory, e.g. data 555 of memory 550 of FIG. 5, that may be referenced directly or indirectly to identify the processing category of the die 503. Although not contemplated as being necessary at this time, if one or more of the plurality of VIs of the die 503 has a different technology process category, the technology process category per individual VI may be determined by having individual data of the data 555 associated with each VI that may be referenced to determine the technology process category of the VI. Population of the data 555 in the memory 550 may be performed at the time of fabrication of the chip at the fabrication facility, or may be performed during initialization of the system. For example, the circuits of VI 505 may be exercised during initialization or boot-up to determine the technology process category of VI 505. Once the technology process category is determined, the data 555 of the memory 550 may be updated accordingly. Currently, the technology process category of each of the VIs of the die 503 are contemplated as having the same technology process category, i.e., the technology process category of the die 503.

FIG. 5 shows the dynamic voltage controller 545 including the memory 550, a temperature monitoring unit (TMU) 565, and a voltage adjusting unit (VAU) 575. The memory 550 stores data for identifying the technology process category, e.g., the data 555, and stores predetermined process-voltage-temperature (PVT) data, e.g., the PVT data 560. The temperature monitoring unit 565 is operatively responsive to the sensed temperature values 535 and 540, and, using the identified technology process category of the die 503, accesses the PVT data 560 to obtain corresponding desired operating voltage values 570 and 573, which correspond to the VIs 505 and 510 that have the corresponding sensed temperature values 535 and 540. The voltage adjusting unit 575 is configured to receive the desired operating voltage values 570 and 573 and adjust corresponding output voltages 515 and 520 based on the desired operating voltage values 570 and 573.

Figure 6:
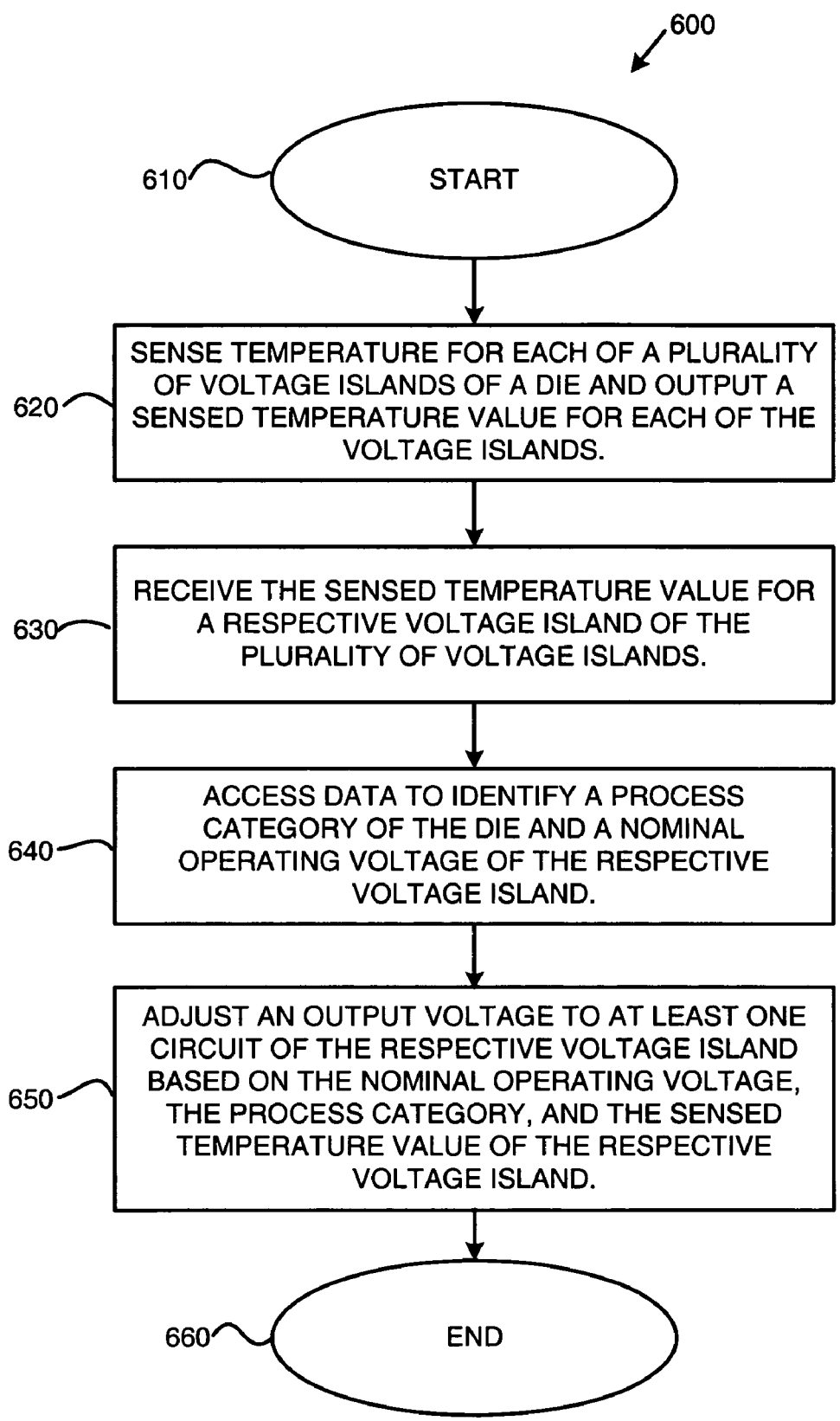
FIG. 6 illustrates a flowchart of an example of a method for adjusting an output voltage to at least one circuit for each of a plurality of voltage islands of an integrated circuit according to an embodiment of the invention.

FIG. 6 illustrates a flowchart of an example of a method 600 according to an embodiment of the invention. The method 600 begins at process block 610. At block 620, a temperature of a VI, e.g., VI 505, is sensed by a temperature sensor, e.g., the temperature sensor 525. The temperature sensor 525 outputs a sensed temperature value 535. At process block 630, the sensed temperature value 535 is received by the temperature monitoring unit 565. At process block 640, the temperature monitoring unit 565 accesses the memory 550, e.g., the data 555, to identify a technology process category of the die 503 and access data 557 to determine a nominal operating voltage of the VI 505. The data 555 and 557 may respectively represent the technology process category and the nominal operating voltage directly, or may point to other data from which these values may be determined. At process block 650, the voltage adjusting unit 575 adjusts an output voltage, e.g., the output voltage 515, to the at least one circuit of the VI 505 of the die 503 based on at least the sensed temperature value 535, the technology process category of the die 503, and the nominal operating voltage of the VI 505. The sensed temperature value 535, the technology process category of the die 503, and the nominal operating voltage of the VI 505 may be used to obtain the desired operating voltage value 570. Based on the desired operating voltage value 570, the voltage adjusting unit 575 may adjust the output voltage 515. It should be understood that the method 600 may be performed iteratively to repeatedly sense the temperature value 535 and repeatedly adjust the output voltage 515 to the circuits of the VI 505. Just as the output voltage 515 to the VI 505 is managed by the dynamic voltage controller 545, the method 600 may be applied to other VIs, e.g., VI 510, of the die 503 to manage output voltages to these other VIs.

Figure 8:
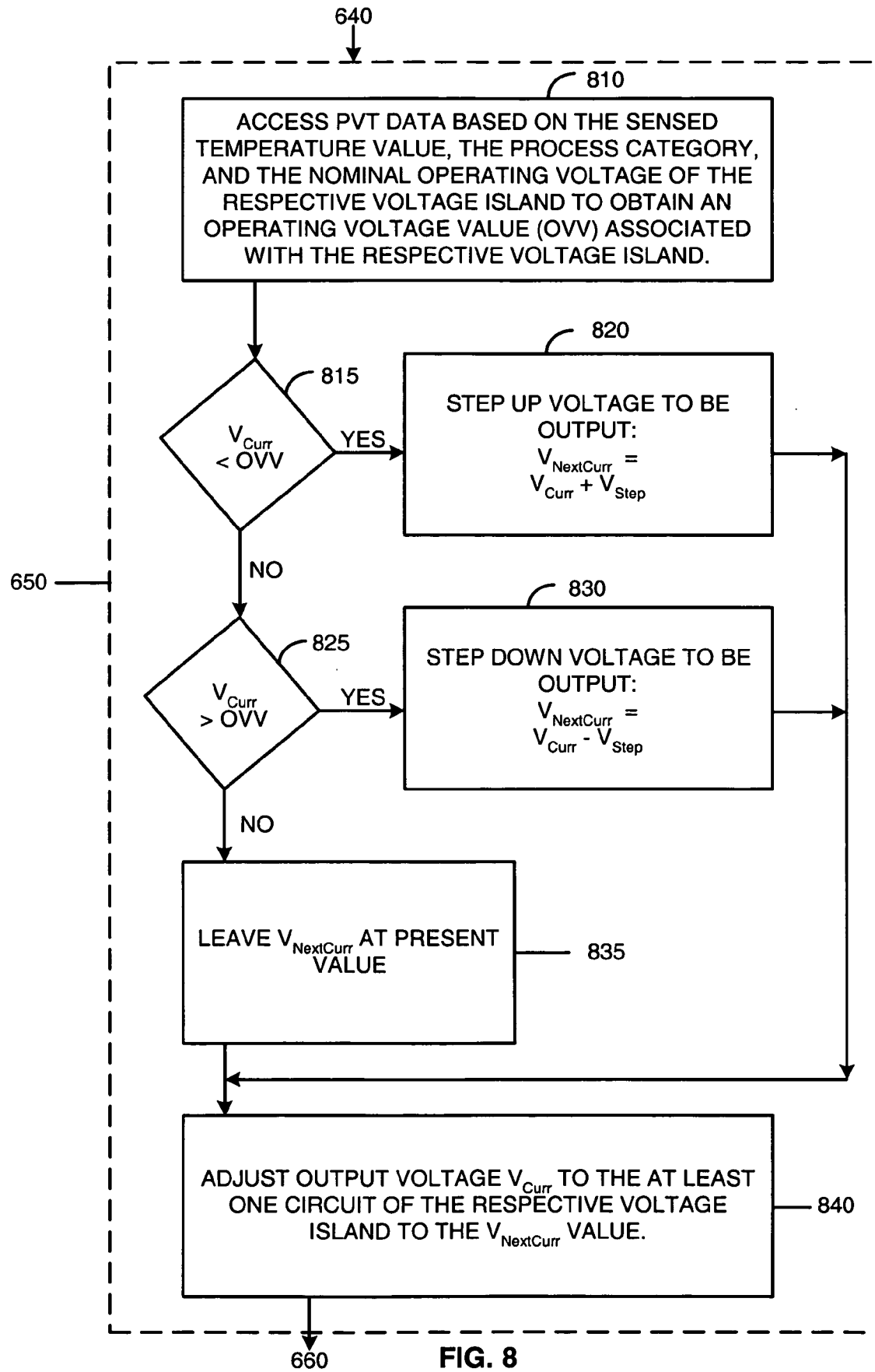
FIG. 8 illustrates a flowchart showing an example of an expanded block of processing of the flowchart for a plurality of voltage islands (VIs) of an integrated circuit die illustrated in FIG. 6.

FIG. 7 illustrates a table showing an example of a process-voltage-temperature data in (PVT) table 700 according to an embodiment of the invention. The PVT table 700 of FIG. 7 shows four columns. The first column has the title "Available Technology Process Category Data", the second "Available Nominal Operating Voltage", the third "Temperature Threshold Data", and the fourth "Desired operating voltage value". The Available Technology Process Category Data of column 1 may be numerical values starting from 1 and going through N for N possible process categories. When the process block 640 of FIG. 6 identifies the technology process category and the nominal operating voltage (e.g. 3.2 volts) for a voltage island of the die 503, e.g., VI 505, the identified technology process category is matched against the Available Technology process category Data of column 1 to determine a row, e.g., row #2 corresponding to a technology process category of #2. For row #2, the nominal operating voltage for the VI 505, e.g., 3.2 volts, is used to determine a subrow. For the subrow determined by technology process category #2 and nominal operating voltage 3.2 volts, the sensed temperature value 535 received at process block 630 is compared to the Temperature Threshold Data of column 3. Based on the temperature range or threshold that the sensed temperature value 535 is found, a corresponding desired operating voltage value from column 4 is determined. For example, if the sensed temperature value 535 is a value $T_x$ between $T_{2,3,2,1}$ and $T_{2,3,2,2}$ of the temperature threshold data, then the desired operating voltage value $V_{2,3,2,2}$ of column 3 is the desired operating voltage value. In this manner, the PVT table 700 of FIG. 7 may be used to look up an desired operating voltage value, e.g., the desired operating voltage value 570 of FIG. 5, based on an identified technology process category for the die 503, a nominal operating voltage for the VI 505, and a sensed temperature value 535 of the VI 505. For the example of the PVT table 700, the table may be designed or predetermined based on possible available process categories and available nominal operating voltages. The nominal operating voltage of a VI typically depends on the types of circuitry on the VI to be operated. Thus, the desired operating voltage value as obtained from the PVT table 700, for example, $V_{2,3,2,2}$ may be used to adjust the output voltage 515 based on current sensed temperature value 535 and technology process category of the die 503. In this manner, the output voltage 515 may be adjusted according to the desired operating voltage value 570 obtained from the PVT table 700 to realize a more desired power consumption by the VI 505 than would be realized by always operating the VI 505 at the nominal operating voltage. FIG. 8 shows an example of how the output voltage 515 may be adjusted incrementally towards the desired operating voltage value 570.

FIG. 8 illustrates a flowchart of an example of an expanded block 650 of the example method 600 illustrated in FIG. 6. The expanded block 650 begins at process block 810 where PVT data of the PVT table 700 is accessed based on at least the sensed temperature value 535, the nominal operating voltage of VI 505, and the technology process category of the die 503 to obtain the desired operating voltage value 570. Processing proceeds to block 815 where the current output voltage 515 is compared to the desired operating voltage value 570. If the current output voltage 515 is less than the desired operating voltage value 570, processing proceeds to block 820 where a next current output voltage variable is set to the value of the current output voltage 515 incremented by a step amount of voltage. The step amount of voltage may be predetermined or may be determined as, for example, the absolute value of the difference between the current output voltage 515 and the desired operating voltage value 570. From block 820 processing flows to process block 840. Alternatively, if the current output voltage 515 is not less than the desired operating voltage value 570, processing proceeds to process block 825 which tests for the current output voltage 515 being greater than the desired operating voltage value 570. If so, at process block 830 the next current output voltage variable is set to the current output voltage 515 minus a step amount of voltage. Processing then proceeds to block 840. If at block 825 the current output voltage 515 is not greater than the desired operating voltage value 570, processing then proceeds to block 835 where the next current output voltage variable is left at its present value, namely at the value of the current output voltage 515. Processing from any of the blocks 820, 830, and 835 proceeds to the processing block 840 which sets the current output voltage 515 to the value of the next current output voltage variable. From block 840, processing continues at process block 660 of FIG. 6. As shown in FIG. 8, the current output voltage 515 may have been adjusted up or down or left the same depending on the comparison of the current output voltage 515 to the desired operating voltage value 570.

Figure 9:
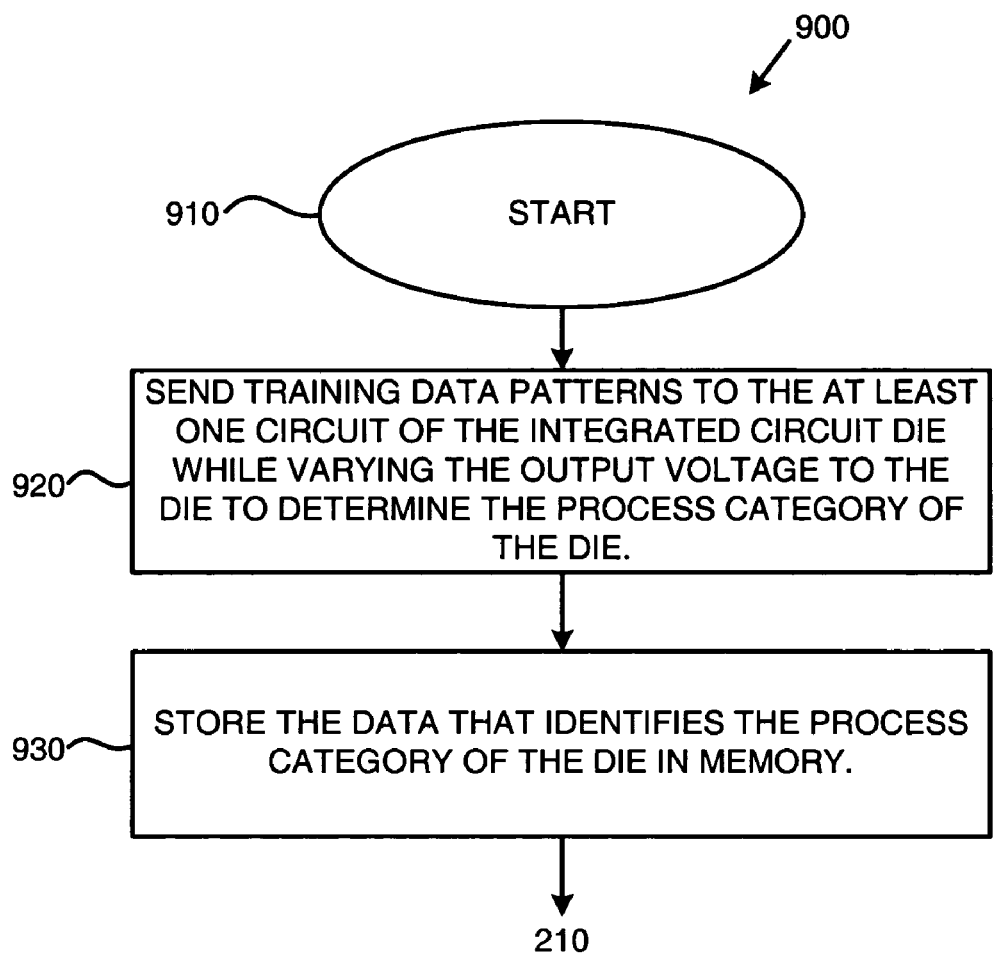
FIG. 9 illustrates a flowchart of an example of a method for determining technology process category of a die according to an embodiment of the invention.

FIG. 9 illustrates a flowchart showing an example of a method 900 according to an embodiment of the invention. The method begins at 910, for example during initialization or boot-up of the system. At initialization or boot-up time, the system (e.g. die) may decide that technology process category data is not available for the die 105, and may exercise the system to determine such data. At process block 920, training data pattern at maximum activities is sent to the circuitry of an integrated circuit die, e.g. Circuit 1 . . . Circuit N of the die 105 of FIG. 1. Training data patterns are selected either from memory or provided externally to exercise the circuits of die 105 at various voltages so as to determine the technology process category of the die 105. At process block 930, data representing the determined technology process category is stored in memory of the die 105, e.g. the data 125 of the memory 145. The data 125 may directly represent the technology process category or may point to other data that determines the technology process category. Processing leaves block 930 and once initialization is complete, enters normal system processing, e.g. the processing at block 210 of FIG. 2, to set the initial operating voltage.

Figure 10:
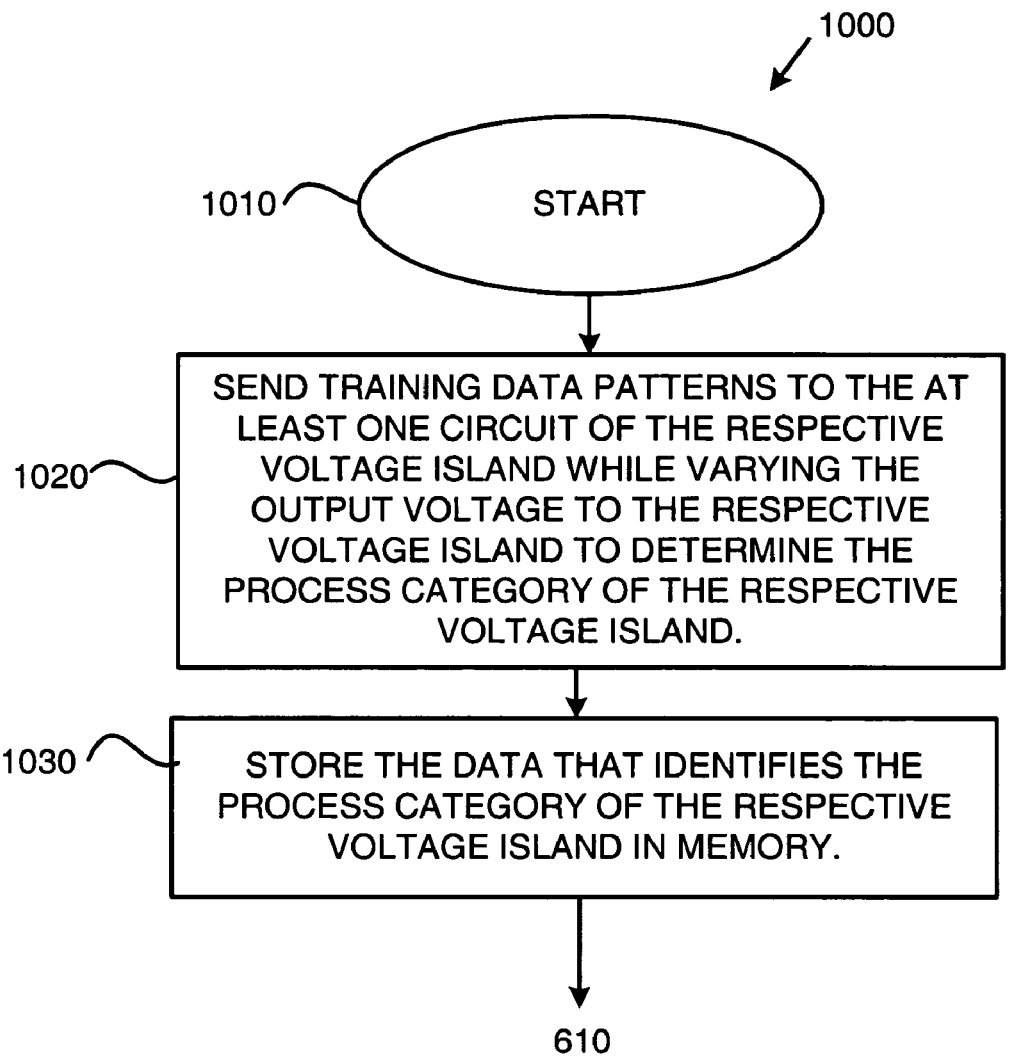
FIG. 10 illustrates another flowchart of an example of a method for determining technology process category of a plurality of voltage islands (VIs) of an integrated circuit die according to an embodiment of the invention.

FIG. 10 illustrates a flowchart showing an example of a method 1000 according to an embodiment of the invention. The method begins at 1010, for example during initialization or boot-up of the system. At initialization or boot-up time, the system may decide that technology process category data is not available for the die 503, and may exercise the system to determine such data. At process block 1020, training data is sent to the circuitry of a voltage island of the die 503, for example to Circuits 1, 2, 3, 4 of the VI 505. It should be understood that although the VIs 505 and 510 of the die 503 are each shown to have four circuits, four circuits are shown only as an example, and the number of circuits within a voltage island of a die may vary in number greater than or less than four. Training data patterns are selected to exercise the circuits of VI 505 of the die 503 at maximum activities, and possibly other VIs of the die 503, at various voltages so as to determine the technology process category of the die 503. At process block 1030, data representing the determined technology process category is stored in memory of the die 503, e.g. the data 555 of the memory 550. The data 125 may directly represent the technology process category or may point to other data that determines the technology process category. Processing leaves block 1030 and once initialization is complete, enters normal system processing, e.g. the processing at block 610 of FIG. 6, to set the initial operating voltage.

It should be apparent to one of common skill in the art that the sensed temperature value, e.g. the sensed temperature value 535 of FIG. 5, may be determined in various ways. In one embodiment, the temperature sensor, e.g. the temperature sensor 525, senses some change in a quantity, such as voltage or current change, and is able to determine and output a sensed temperature value. In another embodiment, the temperature sensor only outputs the change in the quantity, e.g. voltage or current, and another processing element, perhaps even as part of the temperature monitoring unit 565, produces the sensed temperature value. It is to be understood that the method and the arrangement of elements and/or components on the IC die for determining and producing a sensed temperature value are not limiting to the scope of the invention.

As illustrated above, one of the many advantages of the supply voltage management system for an IC die as described herein is the ability to manage power consumption by the IC die or die localities (voltage islands) within the IC die. Not only is the currently sensed temperature value a determining factor in regulating the output voltage to the die or die voltage island, but the processing properties or category (e.g. process corner) of the die or die voltage island is also a considered. For example, based on the processing category and the current temperature value of a die voltage island, it may be determined that the output voltage to the voltage island may be lowered without affecting the clock frequency or speed of the circuitry of the voltage island. Power consumption by the voltage island may be reduced without affecting the processing speed of the circuitry of the voltage island.

The above detailed description and the examples described therein have been presented for the purposes of illustration and description only and not by limitation. For example, the operations described may be done in any suitable manner. The method steps may be done in any suitable order still providing the described operations and results. It is therefore contemplated that the present invention cover any and all modifications, variations or equivalents that fall within the spirit and scope of the basic underlying principles disclosed above and claimed herein.

What is claimed is:

1. A supply voltage management system for an integrated circuit die, comprising:
    a plurality of voltage islands located on the die, each of the plurality of voltage islands comprising at least one circuit requiring a supply voltage associated with the respective voltage island and at least one temperature sensing element configured to sense temperature of the respective voltage island and output a sensed temperature value associated with the respective voltage island; and
    a dynamic voltage controller located on the die and configured to receive the sensed temperature value associated with the respective voltage island, and to identify a technology process category of the die, wherein the dynamic voltage controller adjusts the supply voltage to the respective voltage island based on at least the sensed temperature value and the technology process category of the die.

2. The supply voltage management system of claim 1, wherein the dynamic voltage controller comprises:
    memory that stores data identifying the technology process category of the die and stores sets of predetermined process-voltage-temperature (PVT) data representing groups of voltage settings and differing temperature ranges;
    a temperature monitoring unit operatively responsive to the sensed temperature value associated with the respective voltage island, and based on at least the sensed temperature value and the technology process category of the die, to obtain from the PVT data an desired operating voltage value corresponding to the respective voltage island; and
    a voltage adjusting unit configured to receive the desired operating voltage value from the temperature monitoring unit and adjust the supply voltage to the respective voltage island based on the desired operating voltage value.

3. The supply voltage management system of claim 2, wherein the PVT data includes data representing at least available technology process categories, available nominal operating voltages, temperature thresholds and corresponding desired operating voltage values.

4. The supply voltage management system of claim 2, wherein the memory comprises data identifying a nominal operating voltage of the respective voltage island and the temperature monitoring unit obtains from the PVT data the desired operating voltage value corresponding to the respective voltage island based on the technology process category, the nominal operating voltage, and the sensed temperature value of the respective voltage island.

5. The supply voltage management system of claim 4, wherein the PVT data includes data representing available technology process categories, available nominal operating voltages, temperature thresholds and corresponding desired operating voltage values.

6. A method for adjusting an output voltage to at least one circuit for each of a plurality of voltage islands of an integrated circuit die, comprising:
    sensing temperature for each of the plurality of voltage islands and outputting a sensed temperature value of the respective voltage island;
    receiving the sensed temperature value of the respective voltage island;
    accessing data stored in memory to identify a technology process category of the die; and
    adjusting the output voltage to the at least one circuit for each of the plurality of voltage islands based on at least the sensed temperature value and the technology process category of the die.

7. The method according to claim 6, wherein adjusting the output voltage includes:
    accessing predetermined process-voltage-temperature (PVT) data representing groups of voltage settings and differing temperature ranges, based on at least the sensed temperature value and the technology process category of the die to obtain an desired operating voltage value associated with the respective voltage island; and adjusting the output voltage to the respective voltage island based on the obtained desired operating voltage value associated with the respective voltage island.

8. The method according to claim 6, prior to sensing temperature and outputting a sensed temperature value, comprising:

sending training data patterns to the at least one circuit of the respective voltage island while varying the output voltage to the respective voltage island to determine the technology process category of the respective voltage island; and storing the data that identifies the technology process category of the respective voltage island in memory.

9. The method according to claim 6, wherein:

accessing the data stored in memory also includes accessing data stored in memory to identify a nominal operating voltage of the respective voltage island; and adjusting the output voltage includes adjusting the output voltage based on the technology process category of the die and the nominal operating voltage, and the sensed temperature value of the respective voltage island.

10. The method according to claim 9, wherein adjusting the output voltage includes:

accessing predetermined process-voltage-temperature (PVT) data based on the technology process category, the nominal operating voltage, and the sensed temperature value of the respective voltage island to obtain an desired operating voltage value associated with the respective voltage island; and adjusting the output voltage to the respective voltage island based on the obtained desired operating voltage value associated with the respective voltage island.

11. The method according to claim 9, prior to sensing temperature and outputting a sensed temperature value, comprising:

sending training data patterns to the at least one circuit of the respective voltage island while varying the output voltage to the respective voltage island to determine the technology process category of the die; and storing the data that identifies the technology process category of the respective voltage island in memory.

\* \* \* \* \*